United States Patent [19]

Kramer et al.

[11] Patent Number: 4,667,088
[45] Date of Patent: May 19, 1987

[54] PORTABLE DATA PROCESSING AND STORAGE SYSTEM

[76] Inventors: Kane N. Kramer, Oaktree Lodge, Arkley, Barnet, Hertfordshire; James S. Campbell, 7, Alwyne Place, London, N.1., both of United Kingdom

[21] Appl. No.: 910,350
[22] PCT Filed: Nov. 1, 1982
[86] PCT No.: PCT/GB82/00311
§ 371 Date: Jul. 1, 1983
§ 102(e) Date: Jul. 1, 1983
[87] PCT Pub. No.: WO83/01705
PCT Pub. Date: May 11, 1983

Related U.S. Application Data

[63] Continuation of Ser. No. 517,520, Jul. 1, 1983, abandoned.

[30] Foreign Application Priority Data

Nov. 2, 1981 [GB] United Kingdom ............... 8133003

[51] Int. Cl.⁴ ............................................. G06K 5/00
[52] U.S. Cl. .................................. 235/380; 255/379; 255/487; 255/492
[58] Field of Search ............... 235/380, 487, 492, 379; 365/2

[56] References Cited

FOREIGN PATENT DOCUMENTS 2912139 10/1980 Fed. Rep. of Germany.
2924647 1/1981 Fed. Rep. of Germany.
2115996 3/1985 United Kingdom.

*Primary Examiner*—Harold I. Pitts
*Attorney, Agent, or Firm*—Murray and Whisenhunt

[57] ABSTRACT

A credit card size portable system comprises a bubble memory for storage serially of digital data, especially of sound analogue signal which has been digitally encoded including, a decoder means for converting the memory output into analogue form, preferably several decoders each for one sound band, a control register for controlling input and output of data from the memory and which is responsive to control data present in the input and output stream, and input and output for the data entering and leaving the card system. The memory can be of 8 megabyte size, which can record 3½ minutes of music signal. Optical input can be used, with a photoelectric converter at the input. A card is readily programmed with the digital data and can readily be stored or transported for replay of sound signal as desired, in place of conventional discs or cassettes. The control data bits are detected by the control register and serve to control the recording and replay steps. The digital data may be replayed directly from memory without passing through the decoders for input into another memory upon command from the control register.

14 Claims, 2 Drawing Figures

PORTABLE DATA PROCESSING AND STORAGE SYSTEM

This application is a continuation of Ser. No. 517,520, filed July 1, 1983, now abandoned.

This invention relates to a data processing and storage system, and more particularly to such a system which is constructed so that information in analogue form can be stored in a memory in digital form and can be retrieved as desired and reproduced again in analogue form. The system is particularly intended for the storage of music.

The currently used units for recording music or gramophone records or tape cassettes. We have devised a new method of recording which uses smaller memory units, which are more reliable and robust and for which no moving parts are needed for reproduction, and which units may readily be reprogrammed.

BACKGROUND OF THE INVENTION

The background to the invention is as follows.

The systems of the present invention are portable, most conveniently of the credit card size, wherein data is recorded in magnetic form; systems of this type with magnetic bubble memories are known, e.g. as described in U.S. Pat. No. 3,786,445 and European Published Patent Applications Nos. 13191 and 13192. The card shown in EPA 13191 contains a pair of memories and two controlling units. Such cards and systems are used purely with digital information, corresponding to numerical codes, such as is required for banking or identification purposes, the input being by means of a keyboard, and there has been no prior suggestion of using them for recording analogue information. Cards of such type have the memories arranged so as to allow immediate recall of the data in any portion of the memory.

It is known to store audio information in an electric memory system, but not hitherto in a convenient portable and non-volatile memory unit. U.S. Pat. No. 3,886,189 described a memory based on a ferroelectric capacitor or saturable ferromagnetic reactor of a nonuniform cross-section, but playback from such a memory is destructive of information thereon.

Equipment for the conversion of speech signals to digital form is now well known, and some of this equipment (wave form coders) is suitable for converting music to digital form.

U.S. Pat. No. 4,296,664 describes sound reproduction apparatus in which a decoder converts digital pitch memory elements into analogue form; the memory has eight outputs and the apparatus is not simple and portable as with the system of the present invention.

SUMMARY OF THE INVENTION

In summary, we have devised a simple and convenient data storage system which is used in conjunction with a digital-to analogue decoder in such a way that a digitally encoded signal can be transmitted to the unit and retrieved in analogue form.

According to the present invention we provide a portable data processing and storage system, which comprises: (a) a memory for the storage serially of digital data, (b) means, connected in circuit to the memory, for converting output data from the memory to analogue form, and (c) controlling means for controlling the input and output of data from the memory which means scans all data from the memory, is responsive to control data present in the input or output data stream, and instructs said memory to be ready to receive and store incoming data, and controls the input of analogue data into the memory; (a), (b) and (c) being mounted on a portable card, and on the housing of the card one or two connectors by which the system can be connected to an input of digital data and/or to an output for receipt of the digital or analog data, and one or two connectors to a power supply for the system.

The method of recording data using this system or card comprises feeding into the card an analogue signal which has been encoded into digital form, together with appropriate control data to control the recording and replay steps.

The invention also includes said card when appropriately programmed ready for recording and replay of a specified type of data; and the card containing stored digital data.

A recording system can comprise a plurality of the cards and a single data input source of digital data corresponding to encoded analogue signal, e.g. of music. A replay system is described which allows retrieval of the data from one or more of the cards, for supply to sound reproduction means.

The memory preferably consists of magnetic bubble elements, which are known to be used for storage of data but not for storage of data in digital form for retrieval serially.

DETAILED DESCRIPTION OF THE PREFERRED EMBODIMENTS

Figure 1:
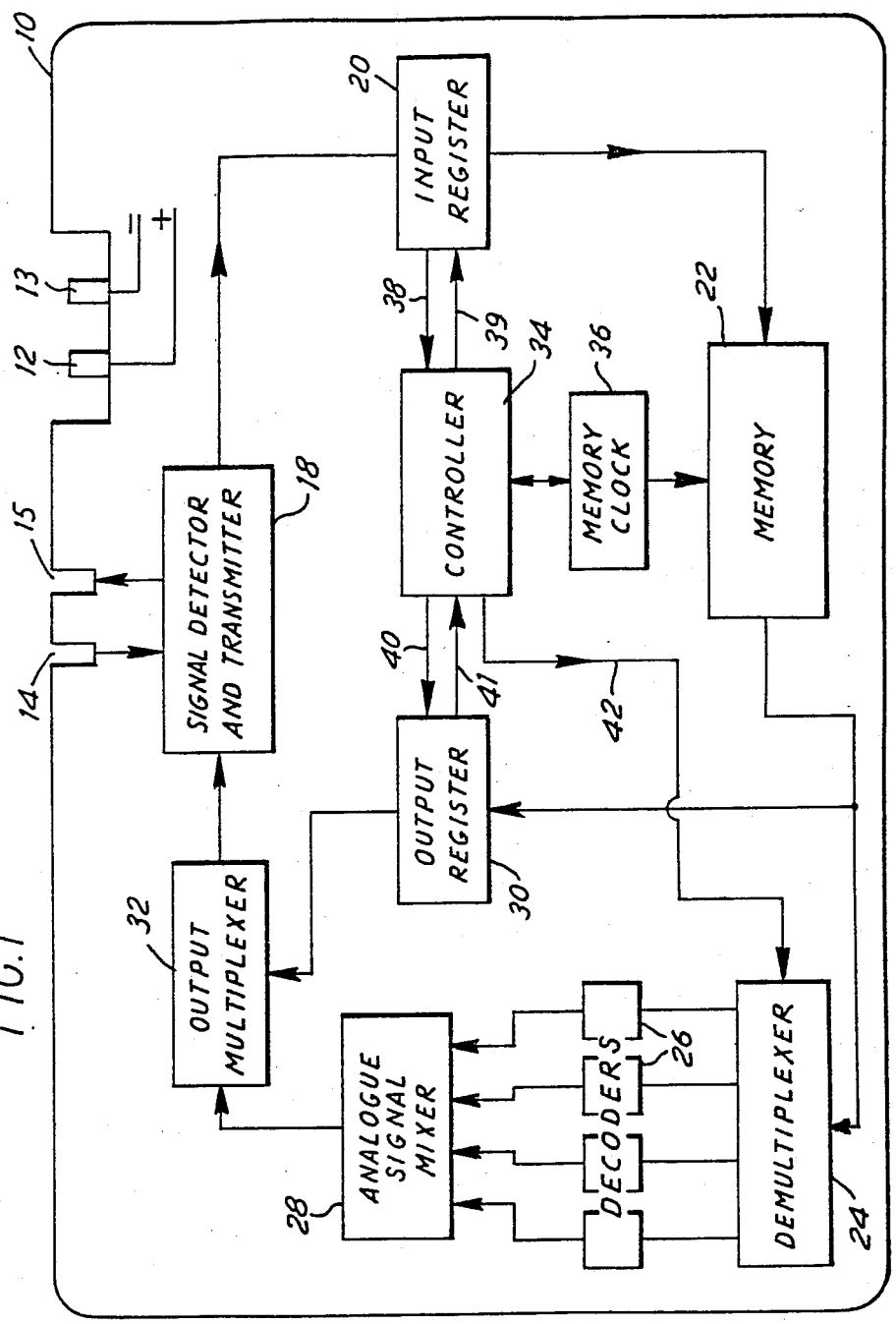
FIG. 1 is a block diagram of a portable data processing and storage card according to the invention.

Referring to FIG. 1, a card 10 is preferably of standard credit card areal size; its thickness, to accomodate a bubble memory, may be 3 to 4 mm. The card has electrical power connections 12, 13. The power is supplied to all the components by appropriate internal connections, which are not shown. The internal links shown in the drawings are all for transmission of data, in the directions shown by the arrows, and all components and connectors except for the memory can be formed as integrated circuits on one or a few silicon slices.

Two connectors 14, 15 are shown for input and output of data. These connections can be for connection to an optical fibre data communications system; in that case an optical receiver and transmitter of known type is required to convert the optical signals to electrical signals. The transmission of data optically has advantages in reduction in signal noise and interference.

Within the card there are a signal detector and transmitter 18 connected to an input control register 20, for inspection of input data, and then to the memory 22 which comprises a crystal slice of magnetic domains between two permanent magnets. On the output side there is a demultiplexer 24 linked to a plurality of digital-to-analogue decoders 26 the outputs of which are combined in a signal mixer 28, and in parallel therewith an output control register 30; the outputs of mixer 28 and register 30 join in an output multiplexer 32. A controller 34 is linked to both the control registers 20, 30 and to the demultiplexer 24 by the respective links 38, 39, 40, 41, 42 and via a memory controlling clock 36 to the memory 22. In place of the single unit 18 shown, there could be separate receptor and transmission units connected respectively to the input 14 and output 15.

All the illustrated links (connectors) are serial, to minimise the number of links needed.

Prior to being used, the control unit 34 is programmed in the factory so as to correctly deal with digitized analogue data, control data and analogue data.

The operation of the system is illustrated as follows for the storage of sound, especially music. The music signal is encoded (outside the illustrated system), into digital form, by any suitable technique; that known as differential pulse code modulation (DPCM) is suitable. The encoding can be optimised by the inclusion of control signals with the sound data. (A pulse code modulation coder quantises sampled sound amplitudes; the differential technique is more efficient and utilises the redundancies present in the sound, the change in analogue signal is recorded digitally at predetermined levels; the method is predictive and the predictive algorithm is externally programmable.) The sound frequency spectrum is subdivided into frequency bands each of which is encoded separately in a sub-band encoder; each frequency domain is programmable, as is the amount of information needed to encode its signal in each time interval, so that the information is directed towards the parts of the sound waveband where it is most needed. The number of frequency bands may correspond to the number of instruments/voices in an ensemble, and should correspond to the number of decoders 26. For recording in stereo, the encoding preferably is done by encoding one channel in terms only of its difference from the other channel; usually this difference will be small enough to allow encoding with substantial saving in information over that needed for separate encoding of two channels. An 8 megabyte memory 22 should allow recording of at least 3½ minutes of music, i.e. corresponding to one side of a "singles" record disc. The memory could be larger to provide a longer recording time. The encoding should be done by use of a program which needs minimal storage in the memory 22.

With a bubble memory, it is necessary to provide, in the encoding and replay systems, means for generating a rotating magnetic field which is required to allow the data to move within the memory.

The encoded data is then fed into input 14 on the card system; if this feed is by optical rather than electrical signal, then the optical signal is converted by photoelectric means to electrical signal at the input stage within the card. Electrical power is applied at 12, 13 to the the system during input and output (no power is needed during the storage of the encoded information, the bubble memory 22 persists without power). The first of the integrated microcircuit components is the signal detector and transmitter 18, this holds the data as needed until it can be subsequently handled. The data stream, in serial order, is passed to the input control register 20 where data which are recognised to be control instruction (not digitised analogue data) are sent via link 38 to the main controller 34. The controller then instructs the memory 22 and its clock to be ready to receive and store the incoming data, and it then instructs the input register 20 to release the encoded analogue data into the memory. The controller can be arranged to send signals externally of the card to show whether or not memory storage is successfully taking place, and to instruct the system supplying the data as to what action to take if error conditions occur during recording.

The memory 22 is preferably organised so as to appear to be a circular shift register of the required size and is clocked at the same speed, controlled by the memory control clock 36, during recording and replay. One "bit" is presented to the memory at a time.

When recording is completed, which can take a very short time, the card is removed from the input recorder and can be stored or transported as required.

For replay of the recorded data, the card is placed in an appropriate replay location (see FIG. 2) with an input 44 thereof in contact with the card output 15. Some means is needed to signal to the controller 34 that replay is to take place; this could be by use of a signal through input 14 via the signal detector and transmitter 18, register 20 and link 38 to controller 34, or via a separate input, e.g. on another face of the card, perhaps actuated by a small press-button. On receipt of the appropriate signal, the controller 34 instructs the memory controller clock 36 to prepare the memory 22 for output of its stored data; the controller also will instruct the demultiplexer 24 (and decoders 26) how to deal with the data which they will receive, if this information is not already adequately programmed into these components. This output will be at a speed much faster (at least 100 times) than that required for actual sound reproduction.

During replay, there is no need to synchronise the memory clock 36 with an external signal, as there is in the recording mode where it must be synchronised with the incoming data. No instructions will therefore be issued to the clock.

The instructions to the decoders 26 and the demultiplexer 24 will be obtained from the memory 22, since they are supplied to the card with the encoded signal. The controller 34 may simply signal to the various devices when the appropriate control information is output from the memory. The controller may recognise further instructions at any stage during replay, and may cause some or all of the devices to be reprogrammed accordingly. The controller will scan all data from the memory and determine which items are intended for it. The demultiplexer 24 will either discriminate between signal and control information itself or will be instructed to do so by the controller.

The demultiplexer 24 directs digital data to the appropriate decoder 26 in accordance with the sub-band of the data. The decoder can read the data at the required slower reproduction rate by taking, e.g. only one out of every 100 bits of information presented to it at a time; the intervening 99 bits will be read on subsequent cycles of memory, so the data in the memory is held in an interleaved fashion. Control or status signals in the data stream from the memory are separated, e.g. by another register, and passed to the output register 30, and can be used via link 41 to keep the controller 24 informed of progress of the replay; the controller simultaneously generates "status" signals.

The decoders 26 operate in reverse manner to the encoder used originally; the analogue data streams produced are combined in mixer 28, and this sound signal is combined in the multiplexer 32 with the status output signals, and the mixed signal is passed to the signal detector transmitter 18 and there to the output 15 of the card and to the input 44 of the replay location. The generated status signals should of course not be of audible pitch; they can be used to control the replay apparatus, e.g. to switch off when the replay has finished. Once started, the replay continues until the end of the recording is reached or until another command is sent to the card.

The data normally remains in the memory 22 after each replay.

In another mode of use, the system can be programmed so that the output is of the data in its digital form; the controller 34 then instruct the output register 30 to pass the data from the memory 22 directly to the output multiplexer 32, without passing through the recoders 26; such a digital output can be used, as mentioned above, as input into another memory, e.g. of another portable card of the invention. (The digital output cannot of course be reproduced as intelligible sound without subsequent decoding.)

The controller 34 could be programmed to keep a count of the number of times that digital data is reproduced, and if desired to cease to allow further such reproductions above a specified maximum number of times; thus the owner of copyright sound data could prevent unlicensed copying, since a copy of satisfactory quality can only be made from the digital data, not from the normal analogue output.

Figure 2:
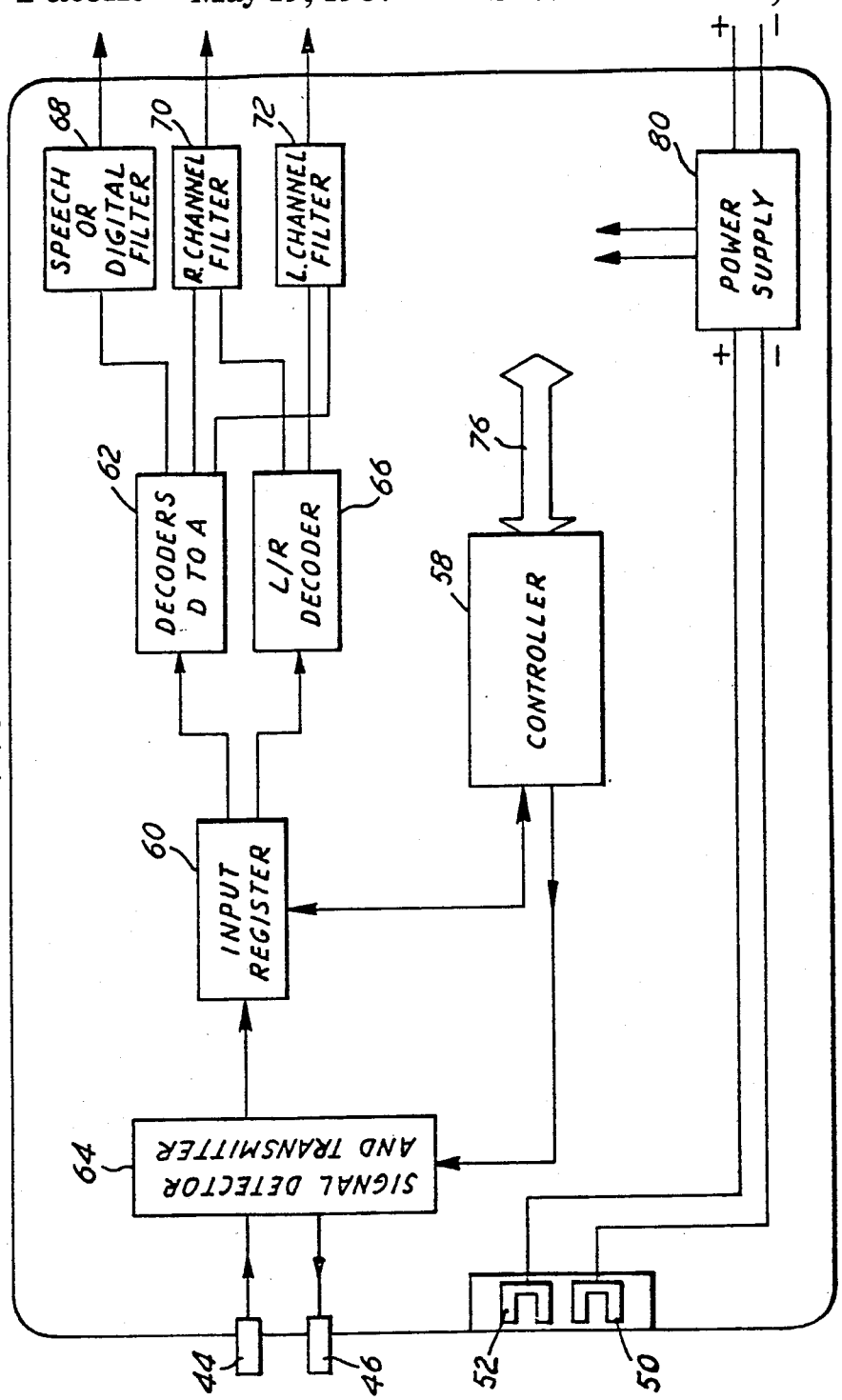
FIG. 2 is a block diagram of a replay unit suitable for use with the card shown in FIG. 1.

Referring to FIG. 2, there is shown a diagram of the essential parts of a replay unit suitable for use with the card already described. Power outputs 50, 52, and data connections 44, 46 are arranged to receive the connections 12, 13, 14 and 15 of the card shown in FIG. 1. A power supply 80 supplies power to sockets 50, 52, and also (by connections not shown) to the other components of the replay unit.

If the data is to be fed in optical form to the card, an optical receiver and transmitter replace the connections 44 and 46 respectively.

A control unit 58, an input register 60, a signal detector and transmitter 63 and digital-to-analogue decoders 62, each of which can be a microchip, are connected in the manner shown.

For stereo reproduction, left/right channel separation is also provided in the decoder 62. This decoder is connected to at least one audio frequency filter; in the diagram three such filters are shown, 72 and 70 being for left-hand and right-hand stereo music channels and 68 being available for speech reproduction, or digital signals, i.e. for a VDU or other display means.

The controller 58 is connected at 76 to external control means, such as press-buttons, for the replay unit (in the manner of a tape cassette machine), and also to signal means, e.g. of lights such as LED, for indicating the mode of operation of the unit. During replay the controller 58 may be programmed to generate at intervals signals which may be fed via links 76 to external means such as a video recorder, to provide second and picture synchronisation.

In use, a card containing encoded data is placed with its respective connections 12, 13, 14, 15 in contact with the sockets 44, 46, 50, 52, power is supplied from unit 80, a command is given to the control unit 58 to commence replay and the recovered data passes to the input register 60, which removes control data from the stream of data, which is passed onto the controller 58, and allows the remaining sound data to pass to the decoder 62 or 66 and thence it is supplied to the filters 68 etc., and thence to an amplifier and loud speakers or headphones (not shown), as desired for sound reproduction.

The third channel 68, for speech or digital signals is only available when the card output is in digital form; alternatively, four channels can be provided.

When analogue signals are transmitted, the digital-to-analogue decoder 62 is bypassed, and the data can instead be in stereo form and separation in the decoder 66 and passed to the respective stereo channels at 70 and 72.

The replay unit, apart from amplifier and loud speakers or headphones, can be very compact, e.g. little larger than the storage system card itself, and this if used with headphones, and batteries as the power supply 58, the entire system can be portable. The unit can have a slot extending within its body, for receipt of a card.

Alternatively, for use in the home, vehicle or commercial applications, a single replay unit can be arranged to receive a plurality of cards, and the control means can be arranged so that the cards can be played in any specified sequence, by respective connection of the appropriate card interface, and signal means can be provided to show which card is being played at any specified time.

The invention may be used in the following ways.

As a replacement of conventional discs or cassettes the card of the invention is highly convenient and portable. A record shop can have a stock of "blank" cards and can encode one with the desired piece of music from a data store in the shop or at a distant location, when requested by a customer. A data store in the shop could be held on one of the card systems of the invention, instructed to give a digital output.

The data stored on the system could be analogue data other than sound, e.g. for recording scientific, technical, medical or computer information.

For recording of music the device of the invention has advantages of small size, reliability and absence of moving parts. Since the recording of sound data can be rapidly performed in a shop, there are considerable savings in costs of reproduction, distribution and the cost of stocks, compared to conventional gramophone record discs and pre-recorded tape cassettes. Moreover, the user can have his card system reprogrammed with a fresh recording when he has no further use for his present recording.

An input to the system could be set up in a shop or other place accessible to the public and controlled by an automatic mechanism so that upon insertion of appropriate money or credit card, either the purchaser's existing card could be reprogrammed with desired music or a new card would be sold, likewise programmed as desired, or the card could be replayed there for the user to hear, in the manner of a "juke box".

We claim:

1. A portable data processing and storage system, having a memory and means for feeding data to, and retrieving it from the memory, which system comprises:
   a. said memory capable of storage serially of digital data,
   b. means, connected in circuit to the memory, for converting output data from the memory to analogue form, and
   c. controlling means for controlling the input and output of data from the memory which means scans all data from the memory, is responsive to control data present in the input or output data stream, and instructs said memory to be ready to receive and store incoming data, and controls the input of analogue data into the memory; (a), (b) and (c) being mounted on a portable card, and on a housing of the card two connectors by which the system can be connected to an input of digital data and to an output for receipt of the analogue or digital form data, and one or two connectors to a power supply for the system.

2. A system as claimed in claim 1, wherein the memory (a) consists of magnetic bubble elements.

3. A system as claimed in claim 1, wherein the conversion means (b) comprises a plurality of decoders each programmable to convert a prescribed type of data, and links are provided to combine the outputs from the decoders before output of the data from the system.

4. A system as claimed in claim 1, which includes a link by which the output from the memory can be passed directly in serial form to the output data connector on the housing, thus bypassing the conversion means (b), upon command from the controlling means responsive to control data present in the output data stream.

5. A system as claimed in claim 1, which includes a control register circuit in each of the input and output streams, which registers are arranged to pass control data to the controlling means (c).

6. A system as claimed in claim 2, wherein the memory has a capacity of at least 8 megabytes of data.

7. A system as claimed in claim 1, containing in its memory stored data corresponding to music as the analogue input.

8. A combination of a system as claimed in claim 1, together with means for converting analogue data to digital data to be stored in the portable system.

9. A combination of at least one system as claimed in claim 1, together with a replay unit which includes means for supplying power to the data storage system, means for connection to the data connections of the storage system, a controller capable of receiving a command and thereupon commending or stopping the replay of data recorded on said system, a detector capable of detecting and removing control data from a stream of output data from said system on its card and for passing said control data to said controller, and means for passing analogue form output data to sound reproduction means.

10. A method of recording data, using a combination as claimed in claim 8, which comprises feeding into the system an analogue signal which has been encoded into serial digital form, together with appropriate control data to control recording and replay steps of the method.

11. A method of recording and replay of music data using a system as claimed in claim 9, wherein each frequency band of the music has been encoded separately and is stored separately in the memory (a), and during output from the portable system the data corresponding to each band is passed, by command of the controlling means (c), to a respective one of the decoders (b), and the decoded analogue signals are combined to give an output signal which is suitable for direct replay as music.

12. A method of digital reproduction of data recorded in a system as claimed in claim 4, wherein the data output from the portable system is in its encoded digital form.

13. A method as claimed in claim 12, wherein the encoded digital output data is used as the input to be stored in the memory of one or more other of said portable systems.

14. A method as claimed in claim 11, wherein the controlling means is programmed to generate at intervals signals which are passed, separately from the stream of output data, to control external synchronisation means.

* * * * *